United States Patent
Wilson et al.

(10) Patent No.: US 9,984,182 B2
(45) Date of Patent: *May 29, 2018

(54) MODEL GENERATION SYSTEM FOR A MACHINE

(71) Applicant: Caterpillar Inc., Peoria, IL (US)

(72) Inventors: Jeremy R. Wilson, Ebensburg, PA (US); James F. Stascavage, Virginia Beach, VA (US); Melinda F. Vergara, Virginia Beach, VA (US); Jeffrey M. Mauntel, Moyock, NC (US); Bradley Dupont, Fort Worth, TX (US)

(73) Assignee: Caterpillar Inc., Deerfield, IL (US)

( * ) Notice: Subject to any disclaimer, the term of this patent is extended or adjusted under 35 U.S.C. 154(b) by 6 days.

This patent is subject to a terminal disclaimer.

(21) Appl. No.: 15/164,507

(22) Filed: May 25, 2016

(65) Prior Publication Data

US 2017/0344671 A1    Nov. 30, 2017

(51) Int. Cl.
*G06F 17/50* (2006.01)
*G05B 17/02* (2006.01)

(52) U.S. Cl.
CPC ......... *G06F 17/5009* (2013.01); *G05B 17/02* (2013.01)

(58) Field of Classification Search
CPC ..... G07C 5/0841; B60C 9/00; G06F 17/5009; G05B 17/02
USPC ...................................... 701/29, 29.1; 703/7
See application file for complete search history.

(56) References Cited

U.S. PATENT DOCUMENTS

| | | | | |
|---|---|---|---|---|
| 4,672,537 A | * | 6/1987 | Katzman | G06F 12/1458 711/E12.093 |
| 5,727,000 A | * | 3/1998 | Pizzica | G01R 31/3177 714/732 |
| 7,689,368 B2 | * | 3/2010 | Douglas | G01N 35/00722 324/71.1 |
| 9,450,833 B2 | * | 9/2016 | Griffith | H04L 43/0817 |
| 9,606,022 B2 | * | 3/2017 | Kumar | G01M 15/02 |
| 9,694,834 B2 | * | 7/2017 | Shubs, Jr. | B61L 15/0081 |
| 2006/0206246 A1 | * | 9/2006 | Walker | G06Q 10/00 701/16 |

OTHER PUBLICATIONS

Erdinc et al., Fast Diagnosis With Sensors of Uncertain Quality, 2008, IEEE, pp. 1157-1165.*

(Continued)

*Primary Examiner* — McDieunel Marc
(74) *Attorney, Agent, or Firm* — Finnegan, Henderson, Farabow, Garrett & Dunner, LLP

(57) ABSTRACT

A model generation system for a machine having a database, a memory to store instructions, and a controller configured to execute the instructions to generate a plurality of interrelated data tables. The data tables may have a sensor table having a sensor row including sensor attributes, a calculation table having a calculation row including calculation attributes associated with a measurement from the sensor, and a fault indicator table including fault indicator attributes based on the measurement or the calculation. The controller may highlight the sensor row using a first color when the sensor table includes a tag identifier associated with the sensor, and highlight the sensor row using a second color when the sensor table does not include the tag identifier. The controller may display the highlighted sensor table on a display device and store the data tables in the database.

20 Claims, 11 Drawing Sheets

(56) References Cited

OTHER PUBLICATIONS

Gomez et al., Fault Detection in Electric Motors by means of the Extended Kalman Filter as Disturbance Estimator, 2014, IEEE, pp. 432-437.*

Kreibich et al., Quality-Based Multiple-Sensor Fusion in an Industrial Wireless Sensor Network for MCM, 2013, IEEE, pp. 4903-4911.*

Zhang et al., A Probabilistic Fault Detection Approach: Application to Bearing Fault Detection, 2011, IEEE, pp. 2011-2018.*

Stein et al., Modelig and Sing Issues for Machi Diagcsics, 1988, IEEE, p. 1924-1929.*

Xue et al., Parametric model-based anomaly detection for locomotive subsystems, 2007, IEEE, p. 1-6.*

Xi et al., Diagnosability of Faults using Finite-state Automaton Model, 2000, IEEE, p. II-367 to II-371.*

U.S. Patent Application of Jeremy R. Wilson et al., entitled "Model Generation and Monitoring System for a Machine," filed May 25, 2016.

\* cited by examiner

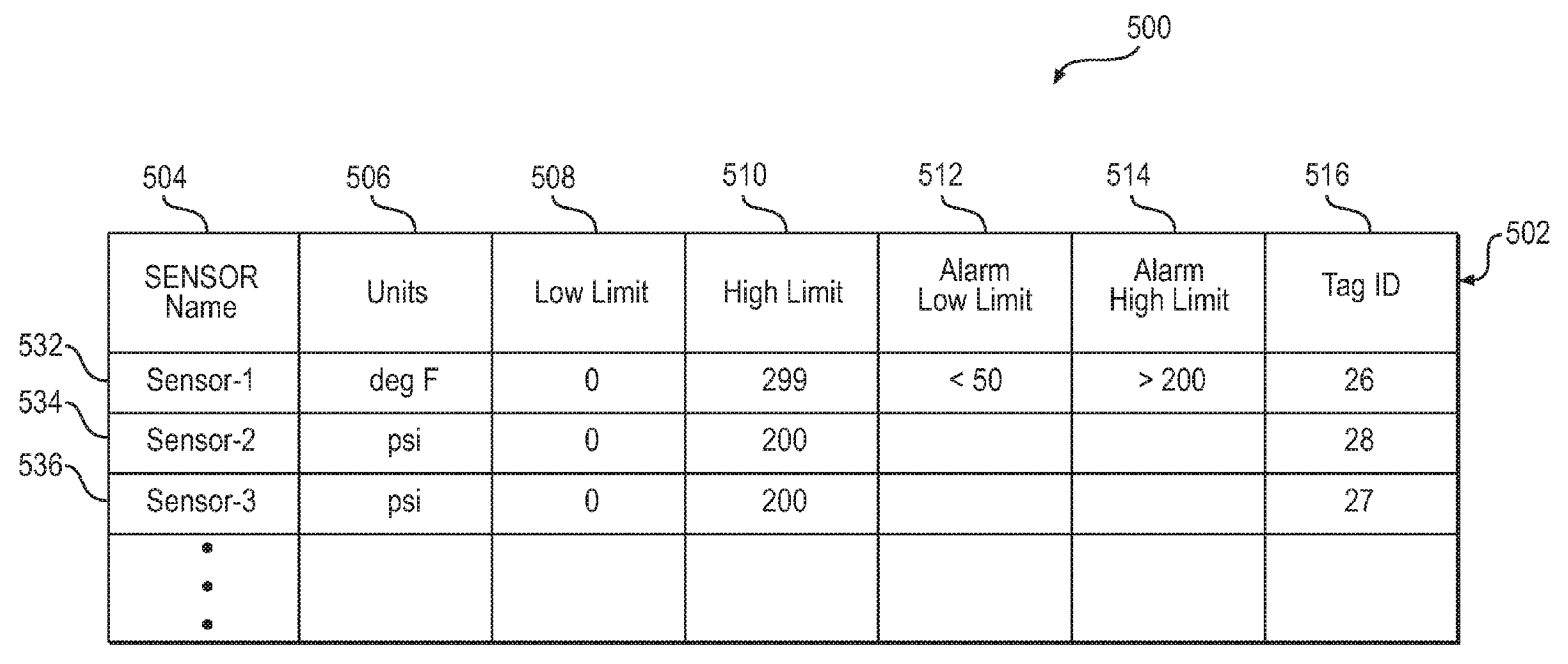

| SENSOR Name | Units | Low Limit | High Limit | Alarm Low Limit | Alarm High Limit | Tag ID |
|---|---|---|---|---|---|---|
| Sensor-1 | deg F | 0 | 299 | < 50 | > 200 | 26 |
| Sensor-2 | psi | 0 | 200 | | | 28 |
| Sensor-3 | psi | 0 | 200 | | | 27 |
| ... | | | | | | |

FIG. 5

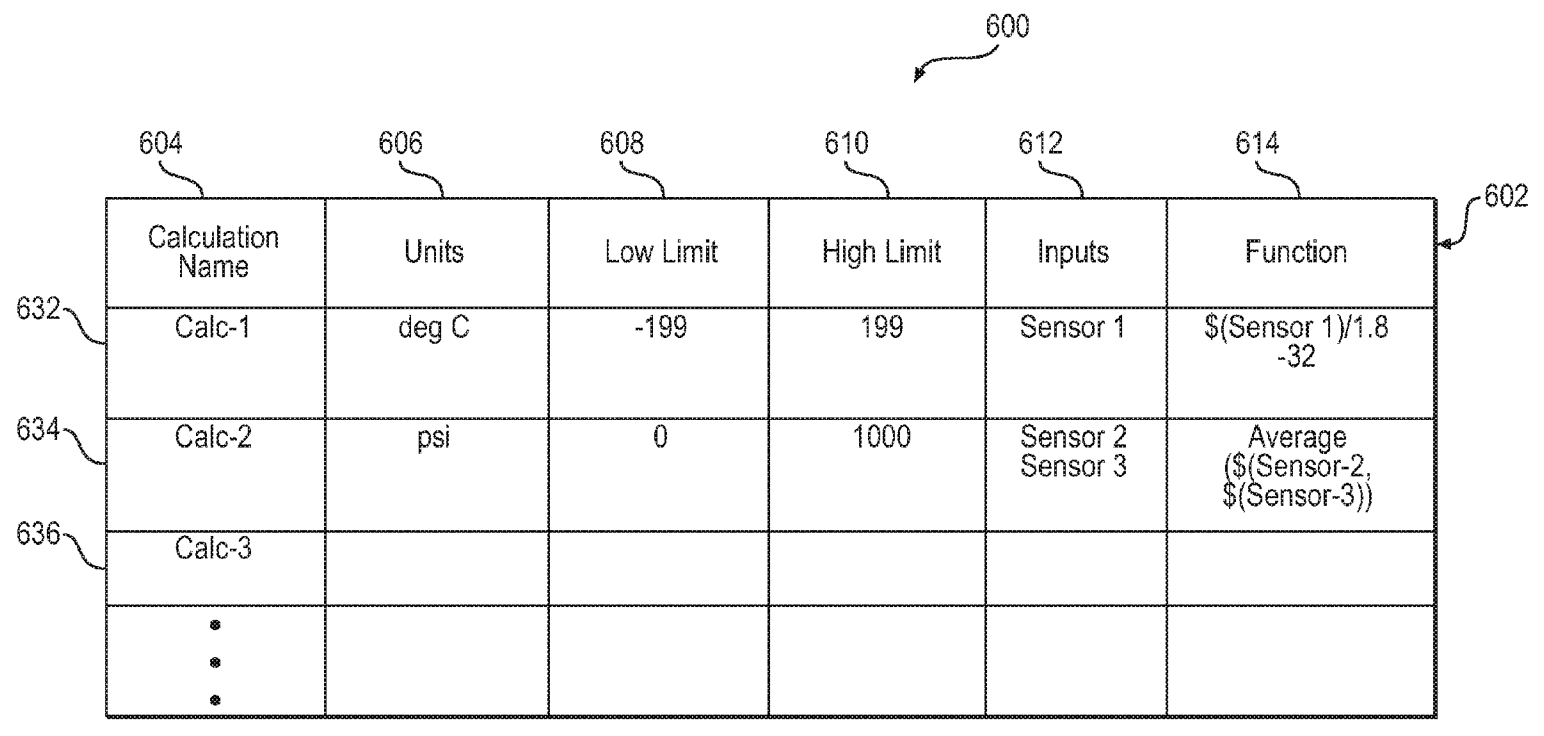

| Calculation Name | Units | Low Limit | High Limit | Inputs | Function |
|---|---|---|---|---|---|
| Calc-1 | deg C | -199 | 199 | Sensor 1 | $(Sensor 1)/1.8 -32 |
| Calc-2 | psi | 0 | 1000 | Sensor 2<br>Sensor 3 | Average ($(Sensor-2, $(Sensor-3)) |
| Calc-3 | | | | | |
| ... | | | | | |

FIG. 6

| Fault Indicator Name | Sensor | Logic | Corrective Actions | Summary Object | Machine State | Flag |
|---|---|---|---|---|---|---|
| Fault-1 | Sensor-1 Sensor-2 | If Sensor 1> 60 Deg C OR If Sensor 2> 100 psi, THEN Fault-1 returns "True," else Fault-1 returns "False" | Clean filters Clean fouling on fins Check stuck valves | SO1 | MS2 | 1 |
| Fault-2 | | | | | | |
| Fault-3 | | | | | | |
| ... | | | | | | |

FIG. 7

| Fault Mode Name | Logic | Child Faults | Summary Object | Machine State |
|---|---|---|---|---|
| Fault Mode-1 | If Sensor-1 > 60 Deg C OR If Calc-2 > 100 psi, THEN Fault Mode-1 returns "True," else Fault Mode-1 returns "False" | Fault-1 Fault-2 | | |
| Fault Mode-2 | | | | |
| Fault Mode-3 | | | | |
| ... | | | | |

| Sensor or Calculation Name | Fault-1 | Fault-2 | Fault-3 | ... |
|---|---|---|---|---|
| Sensor-1 | X | | | |
| Sensor-2 | X | | | |
| Sensor-3 | | | | |
| ... | | | | |
| Calc-1 | | | | |
| Calc-2 | | | | |
| Calc-3 | | | | |

| Fault Indicator Name | Fault Mode-1 | Fault Mode-2 | Fault Mode-3 | ... |
|---|---|---|---|---|
| Fault-1 | X | | | |
| Fault-2 | X | | | |
| Fault-3 | | | | |

| Summary Object Name | Summary Object Name |
|---|---|
| SO1 | If Fault-1 is True for > 20% of the 50 data points, then RED<br>If Fault-1 is True for > 10% of the 50 data points, then Yellow |
| ⋮ | |

| Machine State Name | Machine State Definition |
|---|---|
| MS1 | Shutdown |
| MS2 | If Sensor 1 > 50 deg C |
| ⋮ | ⋮ |

| Chart Name | Abscissa | Ordinate |
|---|---|---|
| Chart-1 | Time | Sensor-1 |
| Chart-2 | Sensor-1 | Sensor-2 |
| Chart-3 | | |
| ⋮ | | |

1304, 1306, 1300, 1308, 1302, 1332, 1334, 1336

MODEL GENERATION SYSTEM FOR A MACHINE

TECHNICAL FIELD

The present disclosure relates generally to a model generation system, and, more particularly, to a model generation system for a machine.

BACKGROUND

Machines, for example, marine vessels, earth-moving machines, construction equipment, etc. include numerous components that may wear and/or fail over time. Repair or replacement of worn out or failed machine components may require removing the machine from service, which may decrease utilization of the machine. The time required to procure a replacement part, or unavailability of repair personnel or facilities may further increase the down time associated with performing maintenance on the machine. Therefore, it is desirable to monitor the wear rate of machine components and/or to predict when the machine may require maintenance including repair or replacement of worn out components. Such monitoring and prediction capabilities may also allow procurement of replacement parts in advance so that the parts are available when the maintenance is scheduled on the machine. In addition, such monitoring and prediction capabilities may make it possible to schedule maintenance activities during a period when the machine is not expected to be in use, thereby maximizing utilization of the machine.

One approach to monitoring the health of machine components relies on analyzing data collected from various sensors associated with the machine. However, collecting sensor data continuously can be expensive because it may require dedicated systems for collection and storage of the sensor data. On the other hand, periodic data collection may mask trends that may help determine the onset or severity of wear of a machine component. Collecting sensor data periodically may fail to capture sensor data during unexpected events, for example, during an unscheduled shutdown of the machine. Thus, there is a need for a diagnostic model that allows collection of data from the right sensors at the appropriate time.

The model generation system of the present disclosure solves one or more of the problems set forth above and/or other problems in the art.

SUMMARY

In one aspect, the present disclosure is directed to a model generation system for a machine. The model generation system may include a database, a memory to store instructions, and a controller configured to execute the instructions to generate a plurality of interrelated data tables. The data tables may include a sensor table including a sensor row having sensor attributes associated with a sensor. The data tables may also include a calculation table including a calculation row having calculation attributes associated with a calculation based on a measurement from the sensor. The data tables may further include a fault indicator table including a fault indicator row having fault indicator attributes associated with a fault indicator based on at least one of the measurement or a result from the calculation. The controller may be configured to determine whether the sensor table includes a tag identifier associated with the sensor, the tag identifier representing an identifier of a component sensor located on a component of the machine. The controller may also be configured to highlight the sensor row in the sensor table using a first color when the sensor table includes the tag identifier. In addition, the controller may be configured to highlight the sensor row using a second color when the sensor table does not include the tag identifier. The controller may be configured to display the highlighted sensor table on a display device. The controller may also be configured to store the data tables in the database.

In another aspect, the present disclosure is directed to a method of generating a model for a machine. The method may include generating, using a controller, a plurality of interrelated data tables. The data tables may include a sensor table including a sensor row having sensor attributes associated with a sensor. The data tables may also include a calculation table including a calculation row having calculation attributes associated with a calculation based on a measurement from the sensor. The data tables may further include a fault indicator table including a fault indicator row having fault indicator attributes associated with a fault indicator based on at least one of the measurement or a result from the calculation. The method may include determining whether the sensor table includes a tag identifier associated with the sensor, the tag identifier representing an identifier of a component sensor located on a component of the machine. The method may also include highlighting the sensor row in the sensor table using a first color when the sensor table includes the tag identifier. The method may further include highlighting the sensor row using a second color when the sensor table does not include the tag identifier. The method may include displaying the highlighted sensor table on a display device. The method may also include storing the data tables in a database.

BRIEF DESCRIPTION OF THE DRAWINGS

FIGS. 5-13 are pictorial illustrations of exemplary data tables generated using the method of FIG. 4.

DETAILED DESCRIPTION

Figure 1:
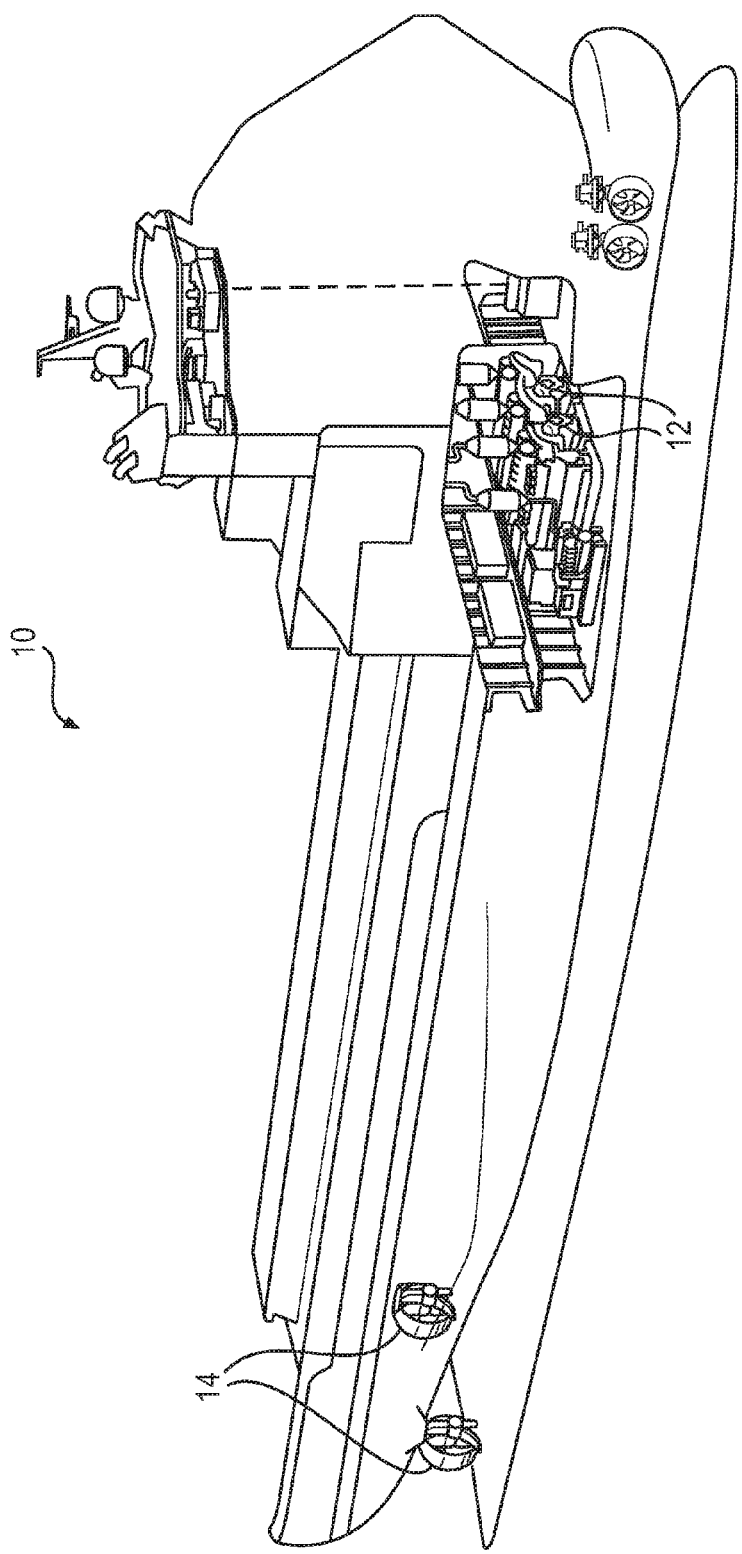
FIG. 1 is a pictorial illustration of an exemplary disclosed machine.

FIG. 1 illustrates an exemplary embodiment of a machine 10. In the disclosed example, machine 10 is a marine vessel. It is contemplated, however, that machine 10 could embody another type of machine (e.g., a wheel loader, dozer, truck, excavator, shovel, etc.). Machine 10 may include, among other things, one or more power sources 12 (e.g. engines) and one or more propellers 14. Engines 12 of machine 10 may be configured to drive propellers 14 to propel machine 10 in a forward or rearward direction. Machine 10 may be equipped with steering mechanisms (not shown) that may allow the direction of motion of machine 10 to be altered. Although only two engines 12 are illustrated in FIG. 1, it is contemplated that machine 10 may have any number of engines 12. It is also contemplated that machine 10 may include other equipment (e.g. generators, motors, pumps, etc.) in addition to engines 12 and propellers 14.

Figure 2:
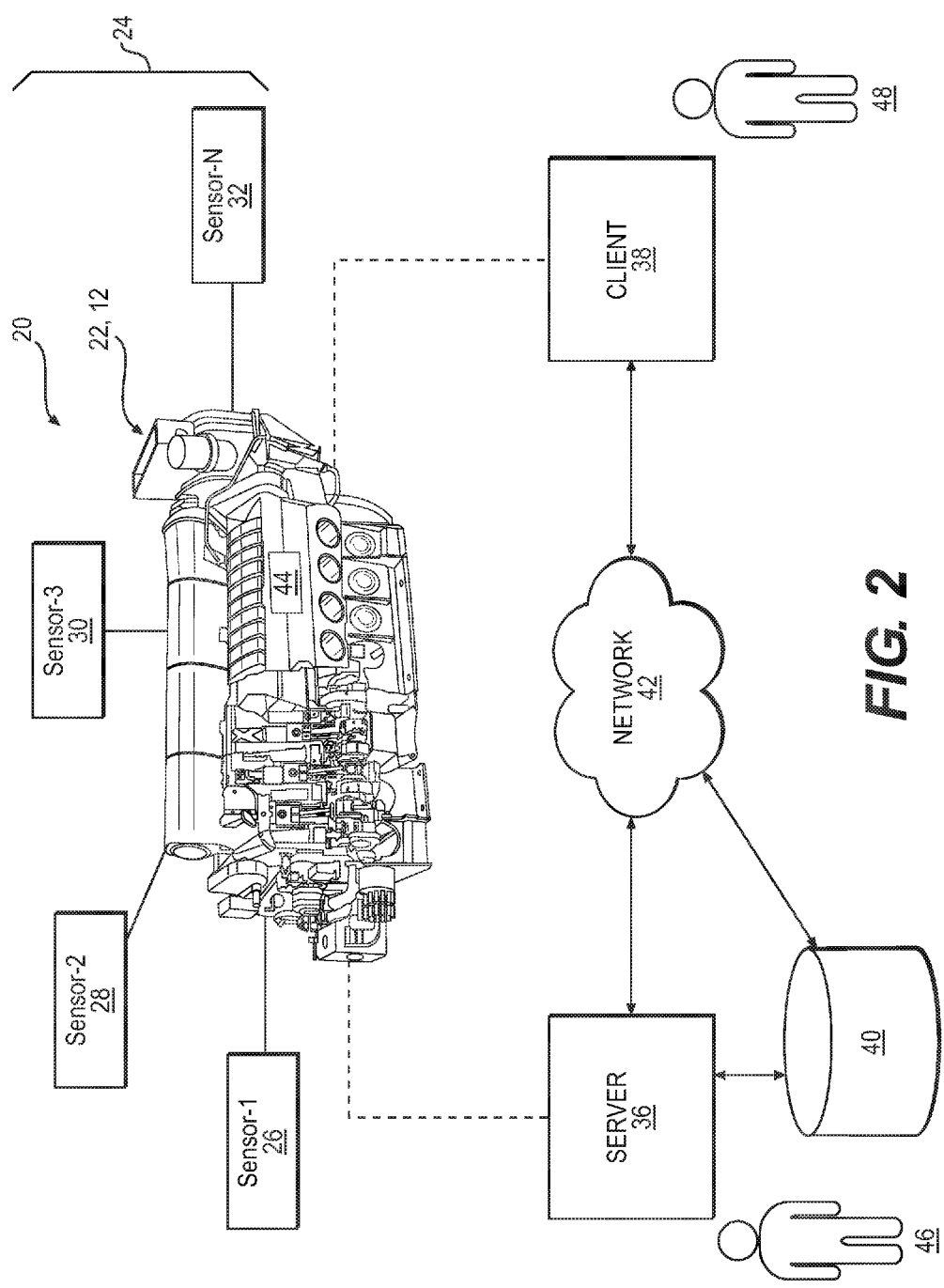
FIG. 2 is a schematic illustration of an exemplary disclosed model generation system for the machine of FIG. 1.

FIG. 2 illustrates an exemplary system 20 for generating a diagnostic model for one or more components 22 of machine 10, and for monitoring the performance of the one or more components 22 of machine 10 using the diagnostic model. In one exemplary embodiment illustrated in FIG. 2, component 22 may be an engine 12. It is contemplated, however, that component 22 may include propellers 14 or other components, for example, motors, generators, pumps, etc. of machine 10. In another exemplary embodiment, component 22 may be the entire machine 10.

System 20 may further include sensor arrangement 24 associated with component 22. For example, as illustrated in FIG. 2, sensor arrangement 24 may include sensors 26, 28, 30, 32, which are titled "Sensor-1," "Sensor-2," "Sensor-3," and "Sensor-N" in FIG. 2. Although only four sensors 26-32 are illustrated in FIG. 2, it is contemplated that component 22 may include any number of sensors 26-32. System 20 may include one or more servers 36, one or more clients 38, and one or more databases 40. Sensors 26-32, servers 36, clients 38, and databases 40, may communicate with each other and exchange information via network 42.

Sensors 26-32 may be configured to monitor a variety of operational parameters associated with component 22. Sensors 26-32 may be one or more of temperature sensors, pressure sensors, flow-rate sensors, speed sensors, torque sensors, power sensors, oxygen sensors, emissions sensors, or any other type of sensors known in the art and configured to measure one or more operational parameters associated with component 22. For example, one or more of sensors 26-32 may be temperature sensors configured to measure temperatures in different portions of component 22 (e.g. combustion chamber of engine 12, intake air entering engine 12, exhaust gas exiting engine 12, etc.). As another example, one or more of sensors 26-32 may be pressure sensors configured to measure pressures in one or more fluid passages associated with component 22 (e.g. pressure of air entering engine 12, pressure of fuel being injected into combustion chambers of engine 12, pressure of exhaust gases exiting engine 12, etc.). As yet another example, one or more of sensors 26-32 may be flow-rate sensors configured to measure flow rates fluids associated with component 22 (e.g. flow rate of fuel supplied to component 22, flow rate of air into combustion chambers of engine 12, etc.).

Component 22 may include one or more controllers 44 configured to control operations of component 22 and/or sensors 26-32. Controllers 44 may be configured to exchange data and/or instructions with sensors 26-32, servers 36, clients 38, and databases 40 via network 42. In one exemplary embodiment, one or more controllers 44 may be configured to control sensors 26-32 to collect data from component 22, continuously or during predetermined time periods.

Server 36 may include one or more servers configured to interact with network 42. Server 36 may be a desktop computer or a server computer. Server 36 may be implemented as a server, a server system comprising a plurality of servers, or a server farm comprising a load balancing system and a plurality of servers. Server 36 may be configured to communicate with client 38, and/or database 40 directly or via network 42. Server 36 may also be configured to communicate with controller 44 and/or sensor arrangement 24 of component 22 directly or via network 42. Client 38 may be a desktop computer or a server computer. Client 38 may be configured to communicate with controller 44 and/or sensor arrangement 24 of component 22 directly or via network 42. Client 38 may also be configured to communicate with server 36 and database 40 directly or via network 42. Server 36 and/or client 38 may be a portable computer, for example, a laptop computer, a tablet computer, or another mobile device known in the art. Server 36 may be operable by operator 46 and client 38 may be operable by operator 48. It is also contemplated that operators 46 and 48 may each be capable of operating one or both of server 36 and client 38.

Database 40 may include one or more logically and/or physically separate databases configured to store data and/or instructions. Data stored in database 40 may include data collected by sensors 26-32 of sensor arrangement 24, instructions executed by server 36 and/or client 38, and/or data or information generated by server 36 and/or client 38. In one exemplary embodiment, database 40 may be implemented using a non-transitory computer-readable storage medium. In another exemplary embodiment, database 40 may be maintained in a network attached storage device, in a storage area network, or combinations thereof, etc. Database 40 may store the data on storage devices, which may include, for example, hard drives, RAID arrays, solid state drives, NOR or NAND flash memory devices, and/or Read Only Memory (ROM) devices. Furthermore, database 40 may be maintained and queried using numerous types of database software and programming languages, for example, SQL, MySQL, IBM DB2®, Microsoft Access®, PERL, C/C++, Java®, etc.

Network 42 may facilitate electronic communication and exchange of data between sensor arrangement 24, server 36, client 38, database 40, and/or controller 44. In certain exemplary embodiments, network 42 may include any combination of communications networks. For example, network 42 may include the Internet and/or another type of local area network (LAN) or wide area network (WAN), an intranet, a metropolitan area network, a wireless network, a cellular communications network, a satellite network, etc.

Figure 3:
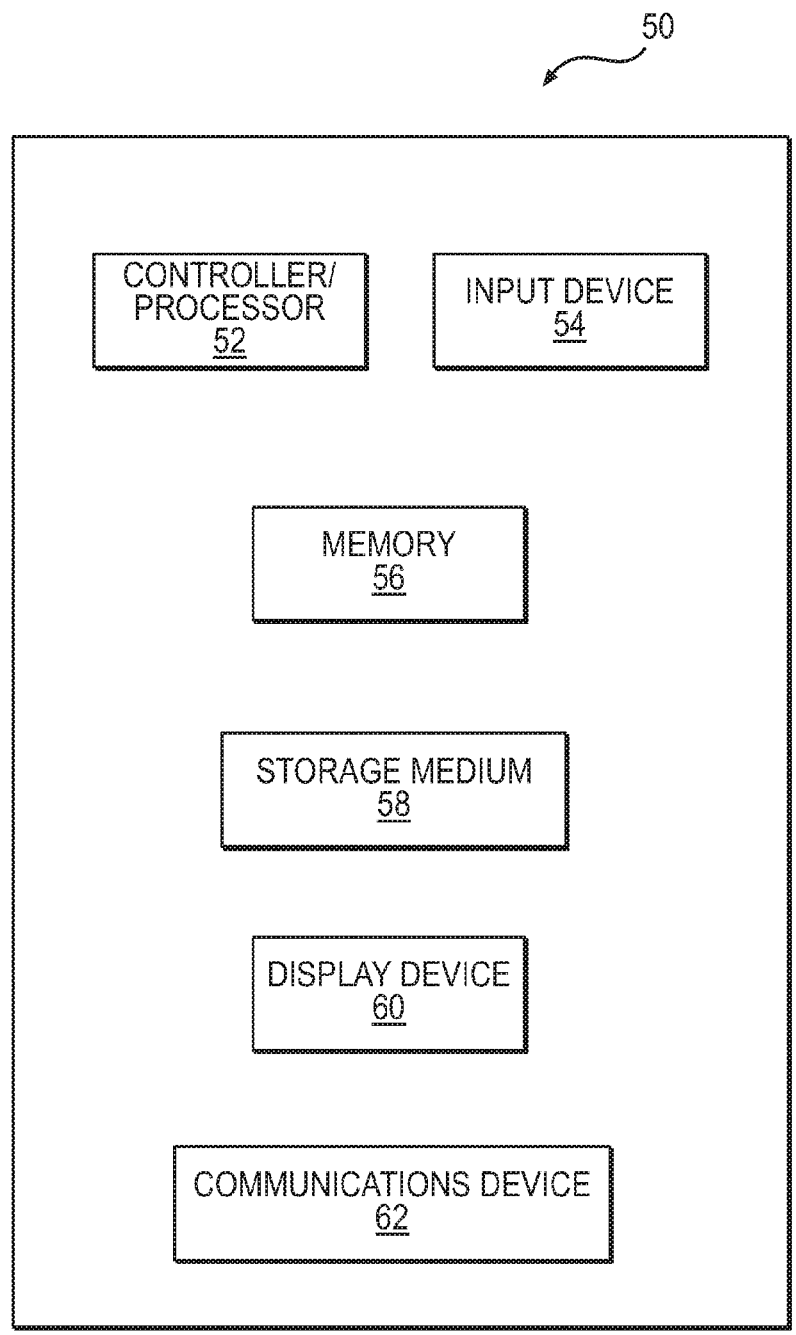
FIG. 3 is a schematic illustration of an exemplary disclosed client or server device used in the model generation system of FIG. 2.

FIG. 3 illustrates an exemplary device 50, which may be a server 36 or a client 38, associated with model generation system 20. Device 50 may include one or more controllers 52, input devices 54, memories 56, storage media 58, display devices 60, and communications devices 62. Controllers 52 may be processors that may be configured to control operations of input devices 54, memories 56, storage media 58, display devices 60, and/or communications devices 62. Controller 44 of component 22, and controllers 52 of server 36 and/or client 38 may each embody a single or multiple microprocessors, digital signal processors (DSPs), etc. Numerous commercially available microprocessors can be configured to perform the functions of each of controllers 44 and 52. Various other known circuits may be associated with each of controllers 44 and 52, including power supply circuitry, signal-conditioning circuitry, and communication circuitry.

Input devices 54 may be associated with controller 52 and may be configured to receive inputs from one or more of operators 46, 48 of system 20. In one exemplary embodiment, input device 54 may enable an operator 46 and/or 48 of system 20 to make selections of one or more portions of text and or graphical images displayed on display device 60. Input device 54 may also enable operators 46, 48 to provide numerical, textual, graphic, or audio-visual inputs to controller 52. Input device 54 may include a physical keyboard, virtual touch-screen keyboard, touch-screen interface, gesture recognition interface, mouse, joystick, stylus, etc. Input device 54 may also include one or more microphones or other audio devices using, for example, speech-to-text and/or voice recognition applications.

Memory 56 may embody non-transitory computer-readable media, for example, Random Access Memory (RAM) devices, NOR or NAND flash memory devices, and Read Only Memory (ROM) devices. Storage medium 58 may embody non-transitory computer-readable media, such as, RAM, NOR, NAND, or ROM devices, CD-ROMs, hard disks, floppy drives, optical media, solid state storage media, etc.

One or more display devices 60 may be associated with controller 52 and may be configured to display data or information in cooperation with controller 52. For example, display device 60 may be configured to display textual and/or image information. Display device 64 may be a cathode ray tube (CRT) monitor, a liquid crystal display (LCD), a light emitting diode (LED) display, a projector, a projection television set, a touchscreen display, or any other kind of display device known in the art. Communication device 62 may be configured to wirelessly send or receive data and/or instructions. Communication device 62 may include hardware and/or software that enable the sending and/or receiving of data and/or instructions via network 42.

In one exemplary embodiment, controller 52 of server 36 may be configured to generate a diagnostic model of engine 12. Controller 52 may execute instructions stored in memory 56, storage medium 58, and/or database 40 to generate the diagnostic model based on inputs received via input device 54, or based on inputs accessed from memory 56, storage medium 58, and/or database 40. In another exemplary embodiment, controller 52 may receive inputs from operators 46, 48 via input device 54 for generating the diagnostic model. As further explained below with respect to FIG. 4, controller 52 may receive inputs regarding one or more sensors 26-32, one or more calculations performed using measurements from the sensors 26-32, one or more fault indicators and/or fault modes based on the measurements or the calculations, one or more machine states, representing operational conditions of component 22 and/or machine 10, and/or one or more charts showing a graphical plot of the measurements from one or more sensors 26-32, or of results from one or more calculations.

Controller 52 may also receive one or more inputs regarding the types of alerts or alarms to be generated when a fault condition occurs. For example, an input may specify that a graphical icon should be displayed on display device 60 when the fault condition occurs. The shape, size, color, and animation of the graphical icon may be based on a severity or frequency of the fault condition. It is also contemplated that the input may specify other types of audio or audio-visual alerts that may be activated based on the fault condition. Controller 52 may generate a plurality of interrelated data tables for the diagnostic model based on the received inputs. Controller 52 may also store the data tables in database 40. In one exemplary embodiment, the data tables generated by controller 52 may include tabs of one or more spreadsheets (e.g. Microsoft Excel spreadsheet) stored in database 40. In another exemplary embodiment, the data tables may be individual tables stored in database 40.

INDUSTRIAL APPLICABILITY

The model generation system 20 of the present disclosure may be used to generate one or more diagnostic models for one or more components of machine 10. In particular, the disclosed system 20 may be used to generate a model using measurements collected from selected sensors during specified operational conditions of machine 10. The disclosed system 20 may be further used to define calculations based on the measurement to determine various component parameters. The disclosed system 20 may also be used to define the fault conditions for the model. Additionally, the disclosed system 20 may be used to define audio, visual, or audio-visual alerts for indicating the fault conditions. The disclosed system 20 may also recommend corrective actions based on the detected fault conditions. An exemplary method of operation of model generation system 20 is discussed below.

Figure 4:
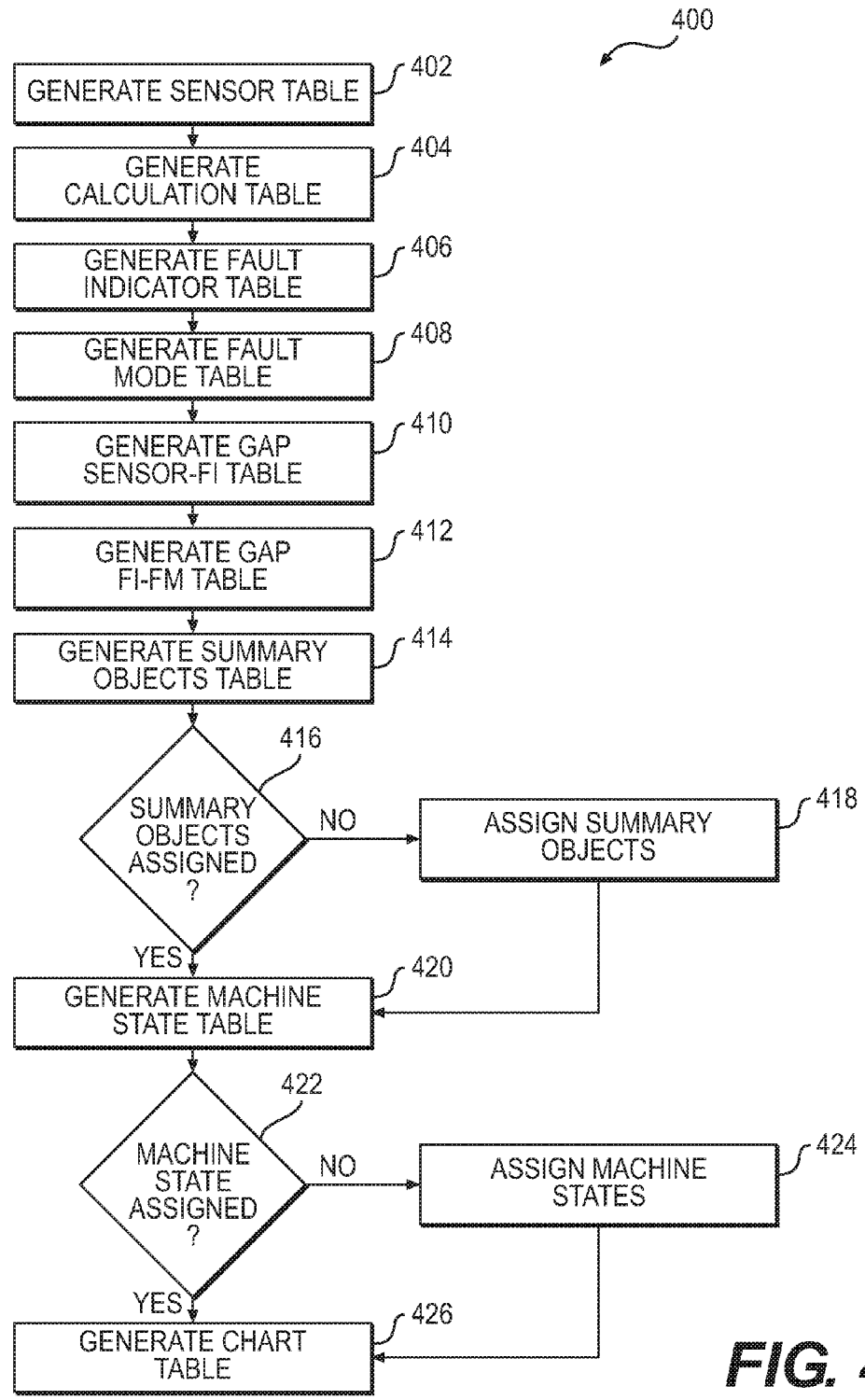
FIG. 4 is a flow chart illustrating an exemplary disclosed model generation method for the model generation system of FIG. 2.

FIG. 4 illustrates an exemplary method 400 of generating a diagnostic model for one or more components 22 (e.g. engine 12) of machine 10. Method 400 may include generation of a plurality of interrelated data tables for the diagnostic model. In one exemplary embodiment, controller 52 may execute instructions stored in memory 56, storage medium 58, or database 40 to perform method 400. The order and arrangement of steps in method 400 is provided for purposes of illustration. As will be appreciated from this disclosure, modifications may be made to method 400 by, for example, adding, combining, removing, and/or rearranging the steps of method 400. Method 400 may be executed by server 36 and/or by client 38.

Method 400 may include a step of generating a sensor table for the diagnostic model (Step 402). Controller 52 may receive inputs via input device 54 regarding one or more sensors 26-32 to generate the sensor table for the diagnostic model. In one exemplary embodiment, the inputs may include one or more sensor attributes, including for example, a name of sensor 26-32, a unit of measurement associated with the quantity measured by sensor 26-32, and lower and upper limit values for the measurement. The lower and upper limit values may represent the minimum and maximum values, respectively, of the measurement made by the selected sensor 26-32. The inputs may also include low and high alarm limits for each sensor 26-32. The low alarm limit may indicate that an alert may be activated when a measurement received from the sensor is less than the low alarm limit. Likewise, the high alarm limit may indicate that the alert may be activated when a measurement received from the sensor is greater than the high alarm limit. Inputs received by controller 52 may also include a tag identifier (Tag ID) for sensor 26-32. The Tag ID may be an identifier of a sensor actually disposed on or in (i.e. physically attached to) component 22. In one exemplary embodiment, Tag ID may be the identifier that controller 44 and/or controller 52 may use to control and obtain measurements from sensor 26-32. Thus, for example, a sensor may have a name "Sensor-2," but a Tag ID "28" (see FIG. 2). It is contemplated that controller 52 may receive inputs regarding one or more sensors that may not physically exist in component 22. It is further contemplated that sensors that do not physically exist in component 22 will not have Tag IDs. Controller 52 may be configured to generate a sensor table based on the received inputs.

FIG. 5 illustrates an exemplary sensor table 500 that may be generated by controller 52. As illustrated in FIG. 5, sensor table may include a title row 502 that may include names of each of a plurality of columns of sensor table 500. As also illustrated in FIG. 5, sensor table 500 may include column 504 titled "Sensor Name," column 506 titled "Units," column 508 titled "Low Limit," column 510 titled "High Limit," column 512 titled "Alarm Low Limit," column 514 titled "Alarm High Limit," and column 516 titled "Tag ID." It is contemplated that sensor table 500 may include fewer or more columns than those illustrated in FIG. 5. Each sensor 26-32 may be listed in a separate sensor row 532, 534, 536, etc., of sensor table 500. Each of sensor rows 532, 534, 536 may include the sensor name, a unit of measurement, lower limit value, upper limit value, lower alarm limit value, upper alarm limit value, and if available a Tag ID in columns 504-516, respectively. For example, as illustrated in sensor row 532 for an exemplary temperature sensor, the inputs may include a name for the temperature sensor (e.g. "Sensor-1"), unit of measurement (e.g. deg F. representing degree Fahrenheit), expected minimum and maximum temperatures (e.g. minimum value of 0 and maximum value of 299), low and high alarm limits (e.g. 50 and 200), and the tag ID (e.g. "26"). Sensors rows 534 and 536 of FIG. 5 illustrate exemplary sensor attributes for Sensor-2 and Sensor-3, respectively. Controller 52 may be configured to generate a sensor table 500 that stores the sensor attributes of each sensor in association with the Sensor Name and Tag ID.

For each sensor row 532-536, etc., controller 52 may determine whether a Tag ID exists in column 516. Controller 52 may highlight a corresponding sensor row 532-536, etc., using a first color (e.g. green) when column 514 includes a Tag ID. When column 514 does not include a Tag ID, controller 52 may highlight a corresponding sensor row 532-536, etc., using a second color (e.g. white). Controller 52 may display the highlighted sensor table 500 on display device 60. Controller 52 may also store sensor table 500 in database 40.

Returning to FIG. 4, method 400 may include a step of generating a calculation table for the diagnostic model (Step 404). Controller 52 may receive inputs via input device 54 regarding one or more calculations or mathematical operations that may be performed on measurements obtained from the one or more sensors 26-32. Each calculation may include one or more mathematical operations to generate a component parameter, which may include, for example, air flow rate, fuel flow rate, air-fuel ratio, lubricant or coolant flow rate, compression ratio, specific fuel consumption, power output, torque output, amounts of effluents (e.g. carbon monoxide, carbon dioxide, nitrous oxide, sulfur dioxide, ammonia, unburned fuel, soot, etc.) in the exhaust gases, change in lubricant or coolant temperatures, or any other operational parameters for component 22 known in the art. In some exemplary embodiments, the mathematical operations may include calculations for converting the units of measurement associated with one or more of the selected sensors 26-32. For example, the inputs may specify a calculation for converting a temperature measured by a sensor in degrees Fahrenheit into a temperature value in degrees Celsius. Controller 52 may be configured to generate a calculation table based on the received inputs. The inputs for each calculation may include one or more calculation attributes of the calculation, for example, a name of the calculation, a unit of measurement associated with a result of the calculation, expected minimum and maximum values of the result, a list of sensors included in the calculation, and a function defining the mathematical operations for the calculation.

FIG. 6 illustrates an exemplary calculation table 600 that may be generated by controller 52. As illustrated in FIG. 6, calculation table may include a title row 602 that may include names of each of a plurality of columns of calculation table 600. As also illustrated in FIG. 6, calculation table 600 may include column 604 titled "Calculation Name," column 606 titled "Units," column 608 titled "Low Limit," column 610 titled "High Limit," column 612 titled "Inputs," and column 614 titled "Function." It is contemplated that calculation table 600 may include fewer or more columns than those illustrated in FIG. 6. Each calculation may be listed in a separate calculation row 632, 634, 636, etc., of calculation table 600. For example, as illustrated in FIG. 6, calculations "Calc-1," "Calc-2," "Calc-3" may be listed in calculation rows 632, 634, 636, respectively. Each of calculation rows 632-636, etc., may include the calculation name, unit of measurement, lower limit value, upper limit value, list of sensors used in the calculation, and a function in columns 604-614, respectively. An exemplary calculation Calc-1 is illustrated in calculation row 632 of calculation table 600. As shown in FIG. 6, the unit of measurement for results of Calc-1 is "deg C.," representing degrees Celsius, the low limit is −199, and the high limit is 199 in columns 606, 608, 610, respectively. The Input to calculation Calc-1 is identified as Sensor-1 in column 612, and the function to convert the measurements of Sensor-1 from degrees Fahrenheit to degrees Celsius is identified as "$(Sensor-1)/1.8-32" in column 614.

For each calculation row 632-636, etc. in calculation table 600, controller 52 may determine whether sensor table 500 includes the sensors identified in column 612. When controller 52 determines that sensor table 500 includes the sensors identified in column 612, controller 52 may highlight the corresponding calculation row (e.g. 632-636) in calculation table 600 using the second color (e.g. white). When controller 52 determines, however, that sensor table 500 does not include the sensors identified in column 612, controller 52 may further determine whether those sensors have Tag IDs listed in column 516 of sensor table 500. When controller 52 determines that column 516 of sensor table 500 includes Tag IDs for the sensors listed in column 612 of calculation table 600, controller 52 may highlight the corresponding calculation row (e.g. 632-636) in calculation table 600 using a third color (grey). In some exemplary embodiments, controller 52 may receive an input indicating that one or more calculations included in calculation table 600 is no longer required. When controller 52 receives an input that one or more of calculations Calc-1, Calc-2, Calc-3, etc. are no longer required, controller 52 may highlight the corresponding rows (e.g. 632-636) in calculation table 600, using a fourth color (e.g. 75% grey). Controller 52 may display the highlighted calculation table 600 on display device 60. Controller 52 may also store calculation table 600 in database 40.

Returning to FIG. 4, method 400 may include a step of generating a fault indicator table for the diagnostic model (Step 406). Controller 52 may receive inputs via input device 54 regarding one or more fault indicators to generate the fault indicator table for the diagnostic model. In one exemplary embodiment, the inputs for each fault indicator may include fault indicator attributes, for example, a fault indicator name, a list of sensors 26-32 associated with the fault indicator, an expression specifying the condition to be evaluated for the fault indicator, and corrective actions to be taken when the condition is satisfied. In one exemplary embodiment, the condition may compare a measurement obtained from a sensor 26-32 to a threshold value. The condition may return a "True" value when the measurement exceeds the threshold value and a "False" value when the measurement is less than or equal to the threshold value. In another exemplary embodiment, the condition may compare measurements obtained from two or more sensors 26-32. The condition may return a "True" value when a first measurement from a first sensor exceeds a second measurement from a second sensor, and a "False" value when the second measurement is less than or equal to the first measurement. Controller 52 may generate a fault indicator table based on the received inputs.

FIG. 7 illustrates an exemplary fault indicator table 700 that may be generated by controller 52. As illustrated in FIG. 7, fault indicator table may include a title row 702 that may include names of each of a plurality of columns of fault indicator table 700. As also illustrated in FIG. 7, fault indicator table 700 may include column 704 titled "Fault Indicator Name," column 706 titled "Sensors," column 708 titled "Logic," column 710 titled "Corrective Actions," column 712 titled "Summary Objects," column 714 titled "Machine State," and column 716 titled "Flag." It is contemplated that fault indicator table 700 may include fewer or more columns than those illustrated in FIG. 7. Each fault indicator may be listed in a separate fault indicator row 732, 734, 736, etc., of fault indicator table 700. For example, fault indicators "Fault-1," "Fault-2," "Fault-3" may be listed in fault indicator rows 732, 734, 736, respectively. Each of fault indicator rows 732-736, etc., may include the fault indicator name, list of sensors associated with the fault indicator, the logic evaluated to trigger the fault indicator, the corrective actions associated with the fault indicator, summary objects associated with the fault indicator, and machine state associated with the fault indicator in columns 704-714, respectively. Column 706 in each row 732-736, etc. may include a list of sensors 26-32, measurements from which may be used in evaluating the logic associated with a fault indicator. An exemplary fault indicator Fault-1 is illustrated in fault indicator row 732 of fault indicator table 700. As shown in FIG. 7, sensors Sensor-1 and Sensor-2 are identified as the sensors associated with fault indicator Fault-1 in column 706. Further, column 708 lists logic indicating that the fault is triggered when measurements from sensor Sensor-1 exceeds 60 degrees Celsius and when measurements from sensor Sensor-2 exceed a pressure of 100 psi. Corrective actions associated with fault indicator Fault-1, including cleaning filters, cleaning fouled fins, and/or checking for stuck valves, are listed in column 708. The inputs for columns 712 and 714 will be explained below in connection with steps 414 and 420, respectively, of method 400.

For each fault indicator row (e.g. 732-736) in fault indicator table 700, controller 52 may determine whether sensor table 500 includes the sensors listed in column 706. When controller 52 determines that sensor table 500 does not include the sensors listed in column 706, controller 52 may highlight the corresponding row (e.g. 732-736) in fault indicator table 700 using the second color (e.g. white). When controller 52 determines, however, that sensor table 500 includes the sensors listed in column 706, controller 52 may further determine whether sensor table 500 includes Tag IDs for those sensors in column 516 of sensor table 500. When controller 52 determines that sensor table 500 includes Tag IDs for the sensors listed in column 712 of fault indicator table 700, controller 52 may highlight the corresponding row (e.g. 732-736) in fault indicator table 700 using a fifth color (e.g. yellow). Controller 52 may also enter a value "1" in column 714 to flag the rows highlighted with the fifth color to indicate that the highlighted fault indicator can be evaluated. Controller 52 may enter a value "0" in column 714 for rows that may not be highlighted using the fifth color. In some exemplary embodiments, controller 52 may receive an input indicating that one or more fault indicators Fault-1, Fault-2, Fault-3, etc. included in fault indicator table 700 is no longer required. When controller 52 receives an input that one or more of Fault-1, Fault-2, Fault-3, etc. is no longer required, controller 52 may highlight the corresponding rows (e.g. 732-736) in fault indicator table 700, using the fourth color (e.g. 75% grey). Controller 52 may display the highlighted fault indicator table 700 on display device 60. Controller 52 may also store fault indicator table 700 in database 40.

Returning to FIG. 4, method 400 may include a step of generating a fault mode table for the diagnostic model (Step 408). Controller 52 may receive inputs via input device 54 regarding one or more fault modes to generate the fault mode table for the diagnostic model. A fault mode may combine one or more fault indicators defined, for example, in fault indicator table 700, using boolean operators. The fault mode may also combine one or more fault indicators with conditions based on one or more calculations in, for example, calculation table 600, using boolean operators. The boolean operators may include well known operators such as "AND," "OR," "NOT," "NAND," "NOR," "XOR," "XNOR," etc. In one exemplary embodiment, for each fault mode, the inputs may include one or more attributes of the fault mode, for example, a name of the fault mode, an expression specifying the condition to be evaluated for the fault mode, and a list of child faults included in the fault mode. The list of child faults may include the fault indicators included in the condition associated with the fault mode. Controller 52 may generate a fault mode table based on the received inputs.

FIG. 8 illustrates an exemplary fault mode table 800 that may be generated by controller 52. As illustrated in FIG. 8, fault mode table may include a title row 802 that may include names of each of a plurality of columns of fault mode table 800. As also illustrated in FIG. 8, fault mode table 800 may include column 804 titled "Fault Mode Name," column 806 titled "Logic," column 808 titled "Child Faults," and column 810 titled "Summary Objects." It is contemplated that sensor table 800 may include fewer or more columns than those illustrated in FIG. 8. Each fault mode may be listed in a separate fault mode row 832, 834, 836, etc., of fault mode table 800. For example, fault modes "Fault Mode-1," "Fault Mode-2," "Fault Mode-3" may be listed in fault mode rows 832, 834, 836, respectively. Each of fault mode rows 832-836, etc. may include the fault mode name, the logic evaluated to trigger the fault mode, and the fault indicators required to evaluate the specified logic in columns 804-808, respectively. The column titled Child Faults for each fault mode row (e.g. 832-836) may include a list of fault indicators identified in, for example, fault indicator table 700, that may be required to evaluate the logic specified in column 806. An exemplary fault mode Fault Mode-1 is illustrated in fault mode row 832 of fault mode table 800. As shown in FIG. 8, the logic in column 806 evaluates whether measurements from Sensor-1 exceed 60 degrees Celsius and whether the result of calculation Calc-2 exceeds a threshold value of 100 psi. Further, column 808 identifies fault indicators Fault-1 and Fault-2 as child faults corresponding to the logic statement in column 806 based on Sensor-1 and Calc-1, respectively. The inputs for columns 810 and 812 will be explained below in connection with steps 414 and 420, respectively, of method 400.

For each fault mode in fault mode table 800, controller 52 may determine whether fault indicator table 700 includes the child faults identified in column 808. When controller 52 determines that fault indicator table 700 does not include the child faults identified in column 808, controller 52 may highlight the corresponding row (e.g. 832-836) in sensor table 800 using the second color (e.g. white). When controller 52 determines, however, that fault indicator table 700 includes the fault indicators identified in column 808, controller 52 may use the values in column 714 to determine whether those fault indicators are available. When controller 52 determines that the fault indicators identified in column 808 of fault mode table 800 are available (i.e. value is 1 in column 714 of fault indicator table 700), controller 52 may highlight the corresponding row (e.g. 832-836) in sensor table 800 using the fifth color (e.g. yellow). In some exemplary embodiments, controller 52 may receive an input indicating that one or more fault modes included in fault mode fault indicator table 800 is no longer required. When controller 52 receives an input that one or more of Fault Mode-1, Fault Mode-2, Fault Mode-3, etc. is no longer required, controller 52 may highlight the corresponding rows (e.g. 832-836) in fault mode table 800, using the fourth color (e.g. 75% partial grey). Controller 52 may display the highlighted fault mode table 800 on display device 60. Controller 52 may also store fault mode table 800 in database 40.

Returning to FIG. 4, method 400 may include a step of generating a gap sensor-FI table (i.e. gap sensor fault indicator table) for the diagnostic model (Step 410). The gap sensor-FI table may help identify one or more of fault indicators Fault-1, Fault-2, Fault-3, etc. that can be evaluated and fault indicators that cannot be evaluated because of availability or unavailability of sensors 26-32 in component 22. Controller 52 may receive inputs via input device 54 regarding one or more sensors, calculations, and/or fault indicators to generate the gap sensor-FI table for the diagnostic model. In some exemplary embodiments, controller 52 may generated the gap sensor-FI table automatically using sensor table 500, calculation table 600, and fault indicator table 700 generated in, for example, steps 402, 404, and 406 of method 400. Each gap sensor-FI row of gap sensor-FI table 900 may include a sensor listed in sensor table 500 or a calculation listed in calculation table 600. In addition, the fault indicators listed in fault indicator table 700 may be listed along columns of the gap sensor-FI table.

Figure 9:
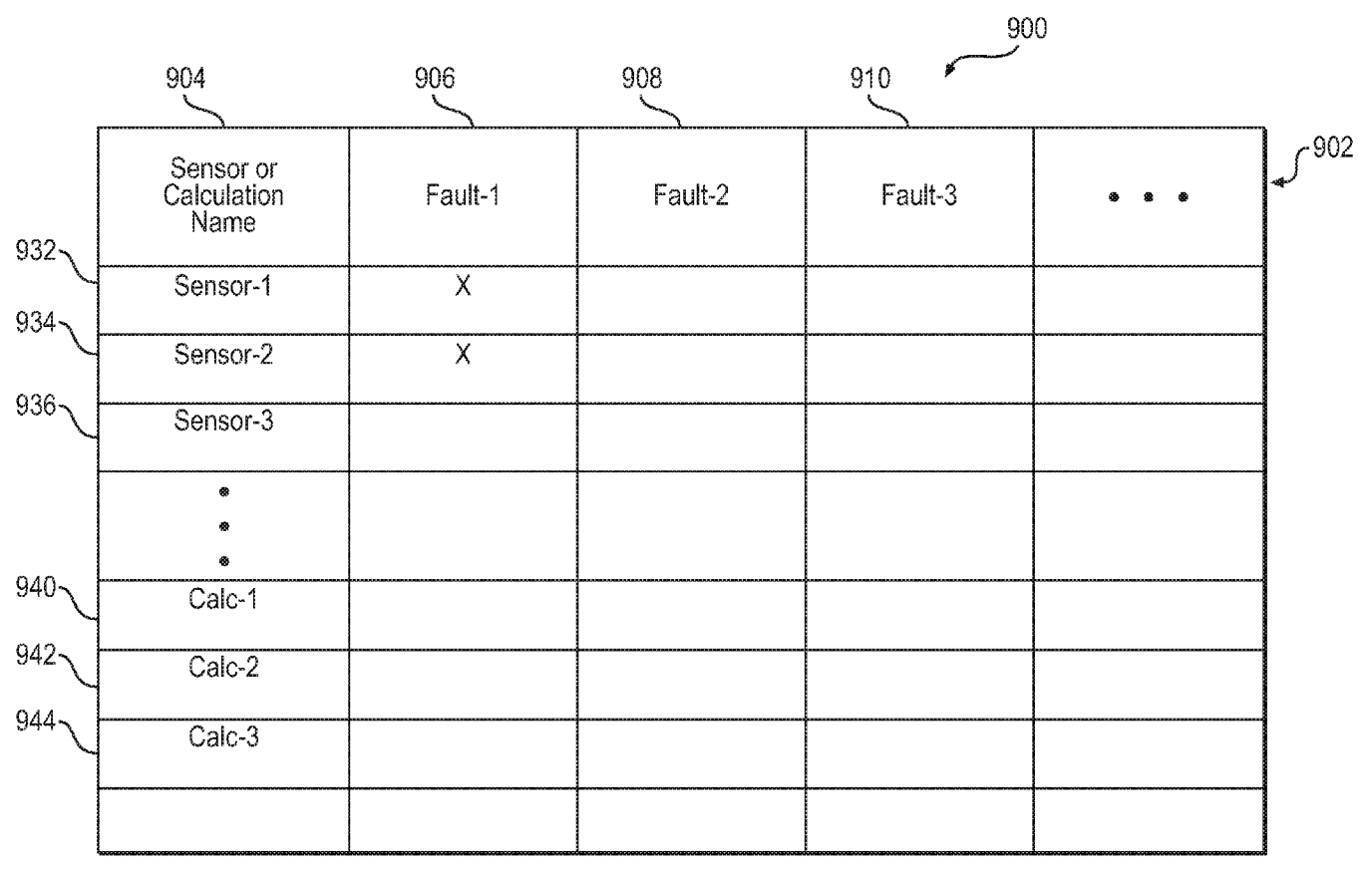

FIG. 9 illustrates an exemplary gap sensor-FI table 900 that may be generated by controller 52. As illustrated in FIG. 9, gap sensor-FI table may include a title row 902 that may include names of each of a plurality of columns of gap sensor-FI table 900. As also illustrated in FIG. 9, gap sensor-FI table 900 may include column 904 titled "Sensor or Calculation Name," column 906 titled "Fault-1," column 908 titled "Fault-2, column 910 titled "Fault-3," etc. It is contemplated that gap sensor-FI table 900 may include any number of columns. Gap sensor-FI table 900 may list each sensor from sensor table 500 and each calculation from calculation table 600 in a separate gap sensor-FI row (e.g. 932-936, 940-944). For example, as illustrated in FIG. 9, sensors Sensor-1, Sensor-2, and Sensor-3 may be listed in gap sensor-FI rows 932, 934, 936, respectively and calculations Calc-1, Calc-2, Calc-3 may be listed in gap sensor-FI rows 940, 942, 944, respectively. Each of rows 932-936, 940-944, etc. may include a label "X" in the one or more fault indicator columns 906-910, etc., when that fault indicator requires a particular sensor or a calculation. Thus, for example, as illustrated in FIG. 9, column 906 in gap sensor-FI rows 932, and 934 includes the label X because fault indicator Fault-1 requires measurements from Sensor-1 and Sensor-2 (see FIG. 7).

For each fault indicator in gap sensor-FI table 900, controller 52 may determine whether sensor table 500 includes the sensors listed in gap sensor-FI rows (e.g. 932-936, 940-944) having the label X. When controller 52 determines that sensor table 500 does not include the sensors in column 904 having a label X (e.g. in columns 906-910), controller 52 may highlight the title row portion of the corresponding columns 906-910, etc., using the second color (e.g. white). When controller 52 determines, however, that sensor table 500 includes the sensors in column 904 having a label X (e.g. in columns 906-910), controller 52 may further determine whether those sensors have Tag IDs in column 516 of sensor table 500. When controller 52 determines that the sensor table 500 includes Tag IDs for the sensors listed in column 904 and having the label X (e.g. in columns 906-910), controller 52 may highlight the title row portion of the corresponding column (e.g. 906-910) using the fifth color (e.g. yellow). Thus, for example, because Sensor-1 and Sensor-2 have Tag IDs in column 516 of sensor table 500, controller 52 may highlight the title row portion containing the title "Fault-1" using the color yellow. In some exemplary embodiments, controller 52 may receive an input indicating that one or more fault indicators included in gap sensor-FI table 900 is no longer required. When controller 52 receives an input that one or more of the fault indicators Fault-1, Fault-2, Fault-3, etc. is no longer required, controller 52 may highlight the title row portion of the corresponding columns (e.g. 906-910), using the fourth color (e.g. 75% partial grey). Controller 52 may display the highlighted gap sensor-FI table 900 on display device 60. Controller 52 may also store gap sensor-FI table 900 in database 40.

Returning to FIG. 4, method 400 may include a step of generating a gap FI-FM table (i.e. gap fault indicator fault mode table) for the diagnostic model (Step 412). The gap FI-FM table may help identify one or more of fault modes Fault Mode-1, Fault Mode-2, Fault Mode-3, etc. that can be evaluated and fault modes that cannot be evaluated based on whether the one or more faults (e.g. Fault-1, Fault-2, etc.) associated with the one or more fault modes can be evaluated. Controller 52 may receive inputs via input device 54 regarding one or more sensors, calculations, and/or fault modes to generate the gap FI-FM table for the diagnostic model. In some exemplary embodiments, controller 52 may generated the gap FI-FM table automatically using sensor table 500, calculation table 600, fault indicator table 700, and fault mode table 800 generated in, for example, steps 402-408 of method 400. Each gap FI-FM row of the gap FI-FM table may include a fault indicator listed in fault indicator table 700. In addition, the fault modes listed in fault mode table 800 may be listed along the columns of the gap FI-FM table.

Figure 10:
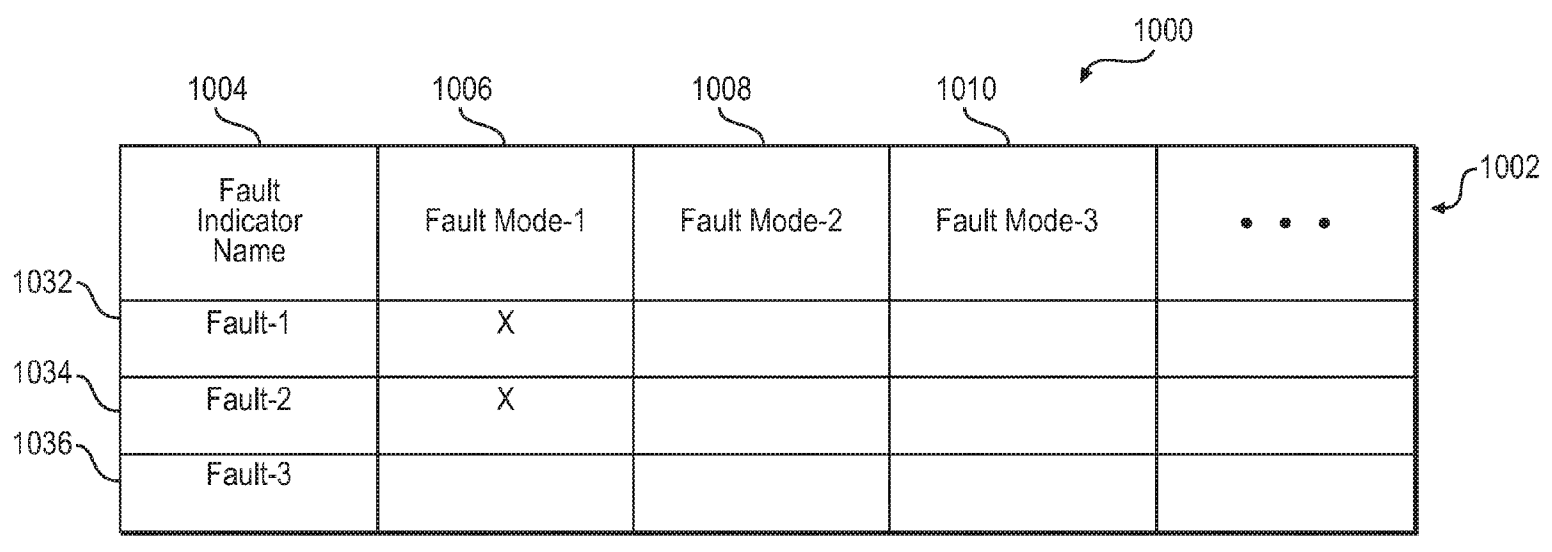

FIG. 10 illustrates an exemplary gap FI-FM table 1000 that may be generated by controller 52. As illustrated in FIG. 10, gap FI-FM table may include a title row 1002 that may include names of each of a plurality of columns of gap FI-FM table 1000. As also illustrated in FIG. 10, gap FI-FM table 1000 may include column 1004 titled "Fault Indicator Name," column 1006 titled "Fault Mode-1," column 1008 titled "Fault Mode-2, column 1010 titled "Fault Mode-3," etc. It is contemplated that gap FI-FM table 1000 may include any number of columns. Gap FI-FM table 1000 may list each fault indicator from fault indicator table 700 in a separate gap FI-FM row (1032-1036. For example, fault indicators Fault-1, Fault-2, and Fault-3 may be listed in rows 1032, 1034, 1036, respectively. Each of rows 1032-1036, etc. may include label X in fault mode columns 1006-1010, etc., when that fault mode requires a particular fault indicator to be evaluated. Thus, for example, as illustrated in FIG. 10, column 1006 includes the label X in gap FI-FM rows 1032 and 1034 because fault mode Fault Mode-1 requires fault indicators Fault-1 and Fault-2 to be evaluated (see FIG. 8).

For each fault indicator listed in gap FI-FM table 1000 that has the label X in any column of gap FI-FM table 1000, controller 52 may identify the sensors (e.g. Sensor-1, Sensor-2, etc.) and/or the calculations (e.g. Calc-1, Calc-2, etc.) required to evaluate the particular fault indicator. Controller 52 may further identify the sensors required to perform the one or more calculations. Controller 52 may make these determinations based on the data included in, for example, data tables 500-700 (see FIGS. 5-7). Controller 52 may determine whether sensor table 500 includes the sensors required to evaluate the specific fault indicator that has a label X in any column in gap FI-FM table 1000. When controller 52 determines that sensor table 500 does not include the sensors, controller 52 may highlight the title row portion of the corresponding columns 1006-1010, etc., and the row portion of column 1004 of the corresponding fault indicator in column 1004, using the second color (e.g. white). When controller 52 determines, however, that sensor table 500 includes the sensors required to evaluate the fault indicator having a label X in any column (e.g. in columns 1006-1010) of gap FI-FM table 1000, controller 52 may further determine whether those sensors have Tag IDs in column 516 of sensor table 500. When controller 52 determines that the sensor table 500 includes Tag IDs for those sensors, controller 52 may highlight the title row portion of the corresponding column and the row portion of column 1004 of the corresponding fault indicator using the fifth color (e.g. yellow). Thus, for example, Fault Mode-1 requires evaluation of Fault-1 and Fault-2, because Sensor-1, Sensor-2, and Sensor-3, which are required to evaluate Fault-1 and Fault-2 have Tag IDs in column 516 of sensor table 500, controller 52 may highlight the title row portion of column 1006 using the color yellow. Controller 52 may also highlight column 1004 in rows 1032 and 1034 using the color yellow. In some exemplary embodiments, controller 52 may receive an input indicating that one or more fault modes included in gap FI-FM table 1000 is no longer required. When controller 52 receives an input that one or more of the fault mode Fault Mode-1, Fault Mode-2, Fault Mode-3, etc. is no longer required, controller 52 may highlight the title row portion of the corresponding columns (e.g. 1006-1010), using the fourth color (e.g. 75% partial grey). Controller 52 may display the highlighted gap FI-FM table 1000 on display device 60. Controller 52 may also store gap FI-FM table 1000 in database 40.

Returning to FIG. 4, method 400 may include a step of generating a summary object table for the diagnostic model (Step 414). The summary object table may help define the conditions when one or more alerts may be triggered based on one or more of the fault indicators or the fault modes listed, for example, in tables 700 and 800, respectively. The one or more alerts in system 20 may include display of a graphical icon (e.g. status pill icon) on display device 60. A status pill icon may be a geometrical shape, for example, triangle, circle, square, rectangle, polygon, or any other shape known in the art. A color of the status pill icon may indicate a severity of one or more fault indicators or fault modes listed, for example, in tables 700 and 800, respectively. A summary object may specify a number of data points that may be used to determine the visual appearance (e.g. color) of one or more status pill icons. In one exemplary embodiment the data points may be individual measurements received from one or more of sensors 26-32. In another exemplary embodiment, the data points may be results of one of more calculations listed, for example, in calculation table 600. In yet another exemplary embodiment, the data points may be a combination of the measurements and the calculations. The summary object may specify the number of data points for which a fault indicator or fault mode must return a "True" value for a status pill icon to display a predetermined color. By way of example, a summary object may specify that when a fault indicator returns "True" for 9 of the past 20 data points, a status pill icon may have a green color (indicating low severity); when the fault indicator returns "True" for 10 to 14 of the past 20 data points, the status pill icon may have a yellow color (indicating medium severity); and when the fault indicator returns "True" for 15 to 20 of the past 20 data points, the status pill icon may have a red color (indicating high severity). Controller 52 may receive inputs via input device 54 regarding summary object attributes, including for example, a summary object name and a summary object definition.

FIG. 11 illustrates an exemplary summary object table 1100 that may be generated by controller 52. As illustrated in FIG. 11, summary object table 1100 may include a title row 1102 that may include names of each of a plurality of columns of summary object table 1100. As also illustrated in FIG. 11, summary object table 1100 may include column 1104 titled "Summary Object Name" and column 1106 titled "Summary Object Definition." It is contemplated that summary object table 1100 may include any number of columns. Each summary object may be listed in a separate summary object row (e.g. 1132), which may include a summary object name and a summary object definition. For example, as illustrated in FIG. 11, summary object row 1132 may include a summary object name "SO1" in column 1104. Further, summary object row 1132 may include a definition of the summary object SO1 in column 1106 stating that "if Fault-1 is True for >20% of 50 data points, then Red and if Fault-1 is True for >10% of 50 data points, then Yellow." The definition of summary object SO1 indicates that the color of the status pill icon should be Red if more than 10 points (20% of 50) cause fault indicator Fault-1 to return "True" and that the color should be Yellow if more than 5 points (10% of 50) cause fault indicator Fault-1 to return "True." One of ordinary skill in the art would recognize summary objects may be defined based on one or more fault indicators and/or fault modes listed in, for example, tables 700 and 800, respectively. Controller 52 may display summary object table 1100 on display device 60. Controller 52 may also store summary object table 1100 in database 40.

Returning to FIG. 4, method 400 may include a step of determining whether one or more summary objects SO1, etc., listed in, for example, summary object table 1100 have been assigned to the fault indicators and fault modes listed in, for example, tables 700 and 800, respectively (Step 416). When controller 52 determines that summary objects have not been assigned (Step 416: No), controller 52 may proceed to step 418. When controller 52 determines, however, that summary objects have been assigned (Step 416: Yes), controller 52 may proceed to step 420.

In step 418, controller 52 may request inputs for assigning each summary object listed in, for example, summary object table 1100. Based on the received inputs, controller 52 may update, for example, column 712 of fault indicator table 700 and column 810 of fault mode table 800 by adding the name of the summary object into columns 712 and/or 810, respectively. For example, as illustrated in FIG. 7, controller 52 may add the label SO1 in row 732, column 712 to indicate that fault indicator Fault-1 may be associated with summary object SO1 in row 1132 of summary object table 1100. Thus, a color of a status pill icon may be determined based on the number of data points for which fault indicator Fault-1 returns a "True" value as specified by summary object SO1 in summary object table 1100.

Step 420 of method 400 may include generating a machine state table for the diagnostic model. A machine state table may help define operating conditions of component 22 and/or machine 10 during which measurements may be obtained from one or more of sensors 26-32 to evaluate one or more fault indicators and/or fault modes. By limiting the collection of sensor data using machine states, system 20 may be able to ensure that measurements from sensors 26-32 may be collected and stored only when necessary. Further, by limiting the collection of sensor data using machine states, system 20 may be able to ensure that measurements from sensors 26-32 may be collected for relevant events that may occur during operation of component 22 and/or machine 10. Controller 52 may receive inputs via input device 54 regarding machine state attributes, including for example, a machine state name and a machine state definition.

FIG. 12 illustrates an exemplary machine state table 1200 that may be generated by controller 52. As illustrated in FIG. 12, machine state table may include a title row 1202 that may include names of each of a plurality of columns of machine state table 1200. As also illustrated in FIG. 12, machine state table 1200 may include column 1204 titled "Machine State Name" and column 1206 titled "Machine State Definition." It is contemplated that machine state table 1200 may include any number of columns. Each machine state may be listed in a separate machine state row (e.g. 1232, 1234, etc.) Each machine state row (e.g. 1232, 1234, etc.) may include a machine state name and a machine state definition. For example, as illustrated in FIG. 12, machine state row 1232 may include a machine state name "MS1" in column 1204. Further, machine state row 1232 may include a definition of the machine state in column 1206, for example, "Shutdown," indicating that certain fault indicators and/or fault modes should be evaluated only during a shutdown event of component 22 or machine 10. Machine states may also be defined based on measurements from one or more sensors 26-32 and/or results of one or more calculations. For example, as illustrated in FIG. 12, machine state row 1234 may include a machine state name "MS2" in column 1204. Further, machine state row 1234 may include a definition of the machine state in column 1206, for example, "Sensor-1>50 deg C.," indicating that certain fault indicators and/or fault modes should be evaluated only when measurements from Sensor-1 exceed 50 degrees Celsius.

Returning to FIG. 4, method 400 may include a step of determining whether one or more machine states MS1, MS2, etc., listed in, for example, machine state table 1200 have been assigned to the fault indicators and/or fault modes listed in, for example, tables 700 and 800, respectively (Step 422). When controller 52 determines that machine states have not been assigned (Step 422: No), controller 52 may proceed to step 424. When controller 52 determines, however, that machine states have been assigned (Step 422: Yes), controller 52 may proceed to step 426.

In step 424, controller 52 may request inputs for assigning each machine state listed in, for example, machine state table 1200. Based on the received inputs, controller 52 may update, for example, column 714 of fault indicator table 700 and column 812 of fault mode table 800 by adding the name of the machine state into columns 714 and/or 812, respectively. For example, as illustrated in FIG. 7, controller 52 may add machine state name MS2 in fault indicator row 732, column 714 to indicate that fault indicator Fault-1 may be associated with machine state MS2. Thus, fault indicator Fault-1 may be evaluated only when component 22 and/or machine 10 has operating conditions which satisfy the machine state definition of MS2 specified in machine state table 1200. Controller 52 may display machine state table 1200 on display device 60. Controller 52 may also store machine state table 1200 in database 40.

Returning to FIG. 4, method 400 may include a step of generating a chart table for the diagnostic model (Step 426). Controller 52 may receive inputs via input device 54 regarding one or more charts to generate the chart table for the diagnostic model. Each chart may include one or more variables which may be selected from sensors 26-32 or from calculations specified in, for example, calculation table 600. In one exemplary embodiment, the inputs may include chart attributes, for example, a chart name, a variable to be plotted on the abscissa axis of the chart, and a variable to be plotted on the ordinate axis of the chart. Controller 52 may generate a chart table based on the received inputs.

FIG. 13 illustrates an exemplary chart table 1300 that may be generated by controller 52. As illustrated in FIG. 13, chart table 1300 may include a title row 1302 that may include names of each of a plurality of columns of chart table 1300. As also illustrated in FIG. 13, chart table 1300 may include column 1304 titled "Chart Name," column 1306 titled "Abscissa," and column 1308 titled "Ordinate." Chart table 1300 may list each chart in a separate chart row (e.g. 1332-1336). For example, charts "Chart-1," "Chart-2," "Chart-3," etc. may be listed in chart rows 1332, 1334, 1336, respectively. Each of chart rows 1332-1336, etc. may include a chart name, a variable for the abscissa axis, and a variable for the ordinate axis in columns 1304-1306, respectively. For example, as illustrated in FIG. 13, chart row 1332, column 1304 lists an exemplary chart titled Chart-1. As shown in FIG. 13, the abscissa is identified as "Time" in column 1306 and the ordinate is identified as "Sensor-1" in column 1308, indicating that Chart-1 will be a plot of the measurements received from Sensor-1 with time. Another exemplary chart Chart-2 is illustrated in chart row 1334 of chart table 1300. As shown in FIG. 13, the abscissa is identified as "Sensor-1" in column 1306 and the ordinate is identified as "Sensor-2" in column 1308, indicating that Chart-2 will be a plot of the measurements received from Sensor-2 versus the measurement received from Sensor-1. Controller 52 may display chart table 1300 on display device 60. Controller 52 may also store chart table 1300 in database 40.

It will be apparent to those skilled in the art that various modifications and variations can be made to the disclosed model generation system without departing from the scope of the disclosure. Other embodiments of the model generation system will be apparent to those skilled in the art from consideration of the specification and practice of the model generation system disclosed herein. It is intended that the specification and examples be considered as exemplary only, with a true scope of the disclosure being indicated by the following claims and their equivalents.

What is claimed is:

1. A model generation system for a machine, comprising:
a database;
a memory to store instructions; and
a controller configured to execute the instructions to:
generate a plurality of interrelated data tables, including:
a sensor table including a sensor row having sensor attributes associated with a sensor;
a calculation table including a calculation row having calculation attributes associated with a calculation based on a measurement from the sensor; and a fault indicator table including a fault indicator row having fault indicator attributes associated with a fault indicator based on at least one of the measurement or a result from the calculation;
determine whether the sensor table includes a tag identifier associated with the sensor, the tag identifier representing an identifier of a component sensor located on a component of the machine;
highlight the sensor row in the sensor table using a first color when the sensor table includes the tag identifier;
highlight the sensor row using a second color when the sensor table does not include the tag identifier;
display the highlighted sensor table on a display device; and
store the data tables in the database.

2. The model generation system of claim 1, wherein the data tables are tabs of a spreadsheet.

3. The model generation system of claim 1, wherein the fault indicator is a first fault indicator, the fault indicator row is a first fault indicator row, the fault indicator table includes a second fault indicator row corresponding to a second fault indicator, and the controller is further configured to execute the instructions to generate a fault mode table including a fault mode row, having:
a fault mode name;
a fault mode logic defining a condition based on the first fault indicator and the second fault indicator; and
a list of child faults including the first fault indicator and the second fault indicator.

4. The model generation system of claim 3, wherein the controller is further configured to execute the instructions to generate a machine state table, including a machine state having:
a machine state name; and
a machine state definition including an operating condition of the component.

5. The model generation system of claim 4, wherein the controller is further configured to execute the instructions to:
determine whether the machine state has been assigned to the fault indicator table; and
when the machine state has not been assigned:
display the fault indicator table on the display device;
receive an input selecting at least one of the first fault indicator or the second fault indicator; and
associate the machine state with the selected one of the first fault indicator or the second fault indicator by entering the machine state name in the fault indicator table.

6. The model generation system of claim 3, wherein the controller is further configured to execute the instructions to:
determine sensors included in the first fault indicator and the second fault indicator;
determine whether the sensor table includes the determined sensors;
determine whether the sensor table includes an associated tag identifier for each of the determined sensors; and
highlight the fault mode row using a third color when the sensor table includes the associated tag identifier for each of the determined sensors.

7. The model generation system of claim 1, wherein the sensor attributes include:
a sensor name;
a first unit of measurement for the measurement from the sensor;
a first lower limit associated with the measurement; and
a first upper limit associated with the measurement.

8. The model generation system of claim 7, wherein the calculation attributes include:
a calculation name;
a second unit of measurement for the result of the calculation;
a second lower limit associated with the result;
a second upper limit associated with the result; and
a mathematical operation associated with the measurement.

9. The model generation system of claim 8, wherein the controller is further configured to execute the instructions to:
highlight the calculation row using the first color when the sensor table does not include the tag identifier; and
highlight the calculation row using the second color when the sensor table includes the tag identifier.

10. The model generation system of claim 1, wherein the sensor row is a first sensor row, the sensor is a first sensor, the fault indicator row is a first fault indicator row, the fault indicator is a first fault indicator, the sensor table includes a second sensor row having attributes associated with a second sensor, the fault indicator table includes a second fault indicator row having attributes associated with a second fault indicator, and the controller is further configured to execute the instructions to:
generate a gap sensor-FI table, including:
a title row;
a first gap sensor-FI row including the first sensor listed in a first column;
a second gap sensor-FI row including the second sensor listed in the first column;
a second column listing a first fault indicator name in the title row; and
a third column listing a second fault indicator name in the title row;
determine whether the first fault indicator includes the first sensor; and
insert a label in the second column of the first gap sensor-FI row when the first fault indicator includes the first sensor.

11. The model generation system of claim 10, wherein the controller is further configured to execute the instructions to:
determine whether the sensor table includes the first sensor;
determine whether the sensor table includes a first tag identifier associated with the first sensor; and
highlight the second column of the title row using a third color when the sensor table includes the first tag identifier.

12. A method of generating a model for a machine, comprising:
generating, using a controller, a plurality of interrelated data tables, including:
a sensor table including a sensor row having sensor attributes associated with a sensor;
a calculation table including a calculation row having calculation attributes associated with a calculation based on a measurement from the sensor; and
a fault indicator table including a fault indicator row having fault indicator attributes associated with a fault indicator based on at least one of the measurement or a result from the calculation;
determining whether the sensor table includes a tag identifier associated with the sensor, the tag identifier representing an identifier of a component sensor located on a component of the machine;
highlighting the sensor row in the sensor table using a first color when the sensor table includes the tag identifier;

highlighting the sensor row using a second color when the sensor table does not include the tag identifier;

displaying the highlighted sensor table on a display device; and storing the data tables in a database.

13. The method of claim 12, wherein the fault indicator is a first fault indicator, the fault indicator row is a first fault indicator row, the fault indicator table includes a second fault indicator row corresponding to a second fault indicator, and the method further includes:

determining a fault mode logic defining a condition based on the first fault indicator and the second fault indicator; and determining a list of child faults based on the fault mode logic.

14. The method of claim 13, further including generating a machine state table, including a machine state having:

a machine state name; and a machine state definition including an operating condition of the component.

15. The method of claim 14, further including:

determining whether the machine state has been assigned to the fault indicator table; and when the machine state has not been assigned:

displaying the fault indicator table on the display device;

receiving an input selecting at least one of the first fault indicator or the second fault indicator;

associating the at least one machine state with the selected one of the first fault indicator or the second fault indicator by entering the machine state name in the fault indicator table; and storing the fault indicator table in the database.

16. The method of claim 13, further including:

determining sensors included in the first fault indicator and the second fault indicator;

determining whether the sensor table includes the determined sensors;

determining whether the sensor table includes an associated tag identifier for each of the determined sensors; and highlighting a fault mode row using a third color when the sensor table includes the associated tag identifier for each of the determined sensors.

17. The method of claim 13, wherein the sensor attributes include:

a sensor name;

a first unit of measurement for the measurement from the sensor;

a first lower limit associated with the measurement; and a first upper limit associated with the measurement.

18. The method of claim 17, wherein the calculation attributes include:

a calculation name;

a second unit of measurement for the result of the calculation;

a second lower limit associated with the result;

a second upper limit associated with the result; and a mathematical operation associated with the measurement.

19. The method of claim 18, further including:

highlighting the calculation row using the first color when the sensor table does not include the tag identifier; and highlighting the calculation row using the second color when the sensor table includes the tag identifier.

20. The method of claim 12, wherein the sensor row is a first sensor row, the sensor is a first sensor, the fault indicator row is a first fault indicator row, the fault indicator is a first fault indicator, the sensor table includes a second sensor row having attributes associated with a second sensor, the fault indicator table includes a second fault indicator row having attributes associated with a second fault indicator, and the method further includes:

generating a gap sensor-FI table, including:

a title row;

a first gap sensor-FI row including the first sensor listed in a first column;

a second gap sensor-FI row including the second sensor listed in the first column;

a second column listing a first fault indicator name in the title row; and a third column listing a second fault indicator name in the title row;

determining whether the first fault indicator includes the first sensor;

inserting a label in the second column of the first gap sensor-FI row when the first fault indicator includes the first sensor;

determining whether the sensor table includes the first sensor and whether the sensor table includes a first tag identifier associated with the first sensor; and highlighting the second column of the title row using a third color when the sensor table includes the first tag identifier.

* * * * *